United States Patent [19]

Amatsu et al.

[11] Patent Number: 4,698,786
[45] Date of Patent: Oct. 6, 1987

[54] MAGNETIC BUBBLE MEMORY DEVICE

[75] Inventors: Masashi Amatsu; Takeyasu Yanase; Hiroshi Inoue, all of Yokohama; Yusuke Nakagawa, Machida, all of Japan

[73] Assignee: Fujitsu Limited, Kawasaki, Japan

[21] Appl. No.: 706,611

[22] Filed: Feb. 28, 1985

[30] Foreign Application Priority Data

Mar. 3, 1984 [JP] Japan ................................. 59-39740

[51] Int. Cl.$^4$ ............................................ G11C 19/08
[52] U.S. Cl. ................................................... 365/39
[58] Field of Search ..................................... 365/39, 43

[56] References Cited

U.S. PATENT DOCUMENTS 4,355,373 10/1982 Bobeck .................................. 365/39
4,514,827 4/1985 Washburn ............................. 365/43

OTHER PUBLICATIONS

K. Yamagishi et al., IEEE Transactions on Magnetics, vol. MAG-19, No. 5, Sep. 1983, pp. 1853–1858.

Primary Examiner—James W. Moffitt
Attorney, Agent, or Firm—Staas & Halsey

[57] ABSTRACT

A magnetic bubble memory device comprises a bubble propagation path defined by a wide-gap pattern. This bubble propagation pattern has a geometry which is favorable for gaining an increase in density and which can provide a high propagation characteristic.

11 Claims, 23 Drawing Figures

MAGNETIC BUBBLE MEMORY DEVICE

BACKGROUND OF THE INVENTION

The present invention relates to a magnetic bubble memory device (hereinafter referred to as "bubble memory"). More particularly, it relates to a geometry of a pattern of magnetically soft elements defining a bubble propagation path in the memory device.

Conventionally, a bubble propagation path in the bubble memory is usually defined by the so-called gap-tolerant half disk (refer to FIG. 1A) or asymmetric chevron-shaped pattern for the magnetically soft elements. However, where it is intended to increase the density of the pattern, to cope with requirements for an increase in capacity of the memory and a reduction in size of the memory device, the analogous reduction in geometry of the gap-tolerant pattern is limited to a pattern period (i.e., propagation period) as small as 6 μm, due mainly to the limitations stemming from forming the gap between the pattern elements by photolithography. Accordingly, a memory chip of, for example, 4 Mbits, is about 15 mm square in size and is larger than a 1 Mbit memory chip about 10 mm square in size. This results in problems arising such as an increase in drive power, and an increase in cost due to the lower number of memory chips that can be manufactured from a wafer.

Figure 1A:
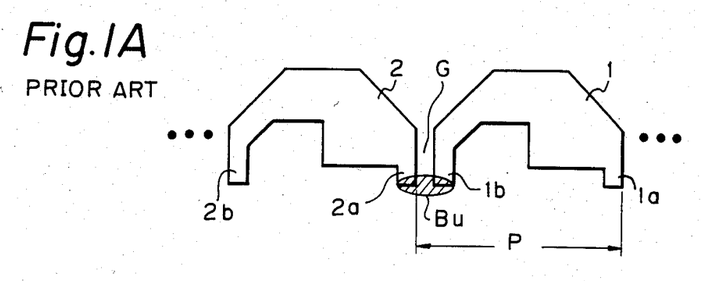
FIGS. 1A and 1B illustrate the principle of bubble propagation in a bubble propagation path defined by a conventional half-disk pattern.
Figure 1B:
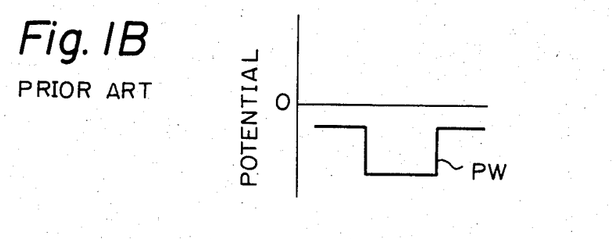
Figure 2A:
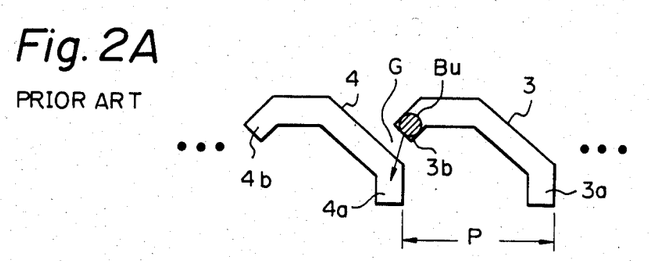
FIGS. 2A and 2B illustrate the principle of bubble propagation in a bubble propagation path defined by a conventional wide-gap pattern.
Figure 2B:
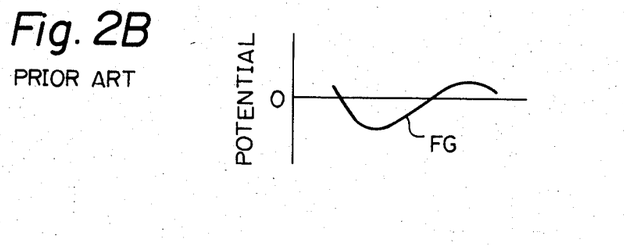

Recently, a new bubble propagation pattern (refer to FIG. 2A), called a "wide-gap pattern", was reported by A. H. Bobeck, et al. (EA-1, 3M Conference, Atlanta, 1981). The wide-gap pattern comprises magnetically soft elements, each of which has an asymmetrically crooked or curved shape with an entrance-side segment and an exit-side segment having different lengths. These elements are arranged at a predetermined period so that the exit-side segment of one adjacent pattern element is opposed to the outer side of the entrance-side segment of the other pattern element, with a gap therebetween. According to a conventional half-disk pattern, as illustrated in FIGS. 1A and 1B, a magnetic bubble Bu is stretched at a wide and deep potential well PW produced in the gap region between the exit-side leg $1b$ of a pattern element 1 and the entrance-side leg $2a$ of a pattern element 2 opposite to each other, with a gap G therebetween, and is propagated from the pattern element 1 to the pattern 2. On the contrary, according to the wide-gap pattern, as illustrated in FIGS. 2A and 2B, a bubble Bu is propagated from a pattern element 3 to a pattern element 4 along the field gradient or potential gradient FG produced in the gap region between the exit-side segment $3b$ of the pattern element 3 and the entrance segment $4a$ of the pattern element 4, opposed to each other with a gap G therebetween. The gap tolerance of the wide-gap pattern is about twice that of the half-disk pattern. In fact, it has been proved that a wide-gap pattern for the propagation of about 2-μm diameter bubbles having a pattern period P=8 μm and a gap width G=2 μm provides a bias margin of 30 Oe at the triangular drive field of 40 Oe, which is about twice that of the half-disk pattern having the same pattern period and gap width. Accordingly, the wide-gap pattern is favored where an increase in density is desired, and ways of making this wide-gap pattern fit for practical use have been proposed in, for example, U.S. Pat. No. 4,355,373.

In known wide-gap patterns, however, there is a problem that, where the pattern geometry is reduced in order to achieve a 4 Mbit memory chip, having the pattern period P=4 μm and the gap width G=1 μm, the potential in the gap region is very shallow and, as a result, the movement of the bubble at the beginning of the propagation thereof from the pattern element 3 to the pattern element 4 is very unstable and a satisfactory propagation characteristic cannot be ensured.

Figure 11:
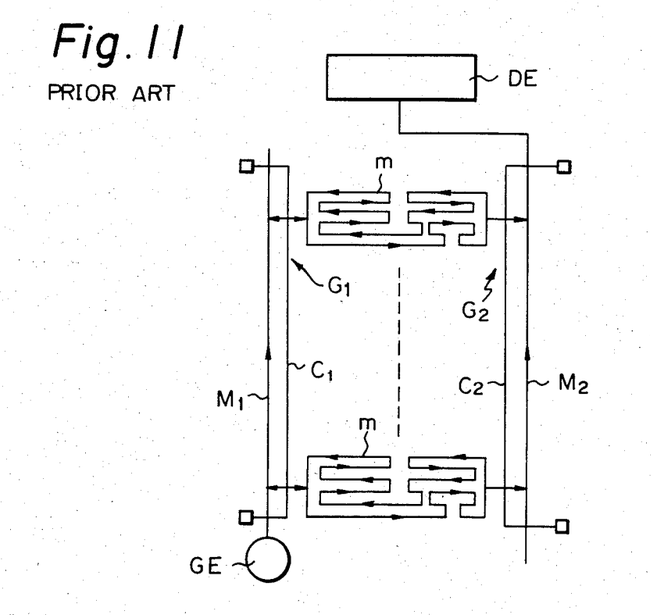
FIGS. 11 and 12 illustrate conventional different arrangements of the bubble propagation path in the bubble memory, respectively.
Figure 12:
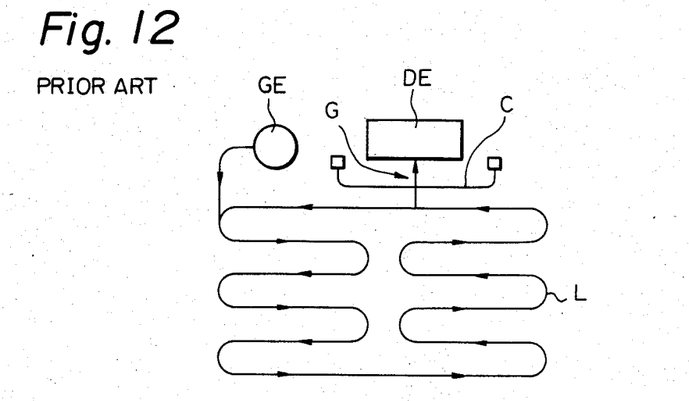

Further, for the arrangement of the bubble propagation path in the bubble memory device, a single loop (or serial loop) arrangement and a major-minor loop arrangement are known in the prior art (refer to FIGS. 11 and 12). In these arrangements, the bubble propagation path usually has an outbound track and a return track, which are arranged in parallel to each other and opposite in the direction of bubble propagation. In particular, the outbound track and the return track are indispensable for forming the minor loop in the major-minor loop arrangement. However, as described hereinafter, where the outbound track and the return track of the bubble propagation path are defined by, for example, the wide-gap patterns having the same geometry, the propagation characteristics of the outbound track and the return track are different from each other, due to the magnetic anisotropy of the bubble crystal and, accordingly, the propagation characteristic of the entire propagation path is defined by the worse track among the outbound tracks and the return tracks, thereby resulting in unsatisfactory propagation characteristics.

SUMMARY OF THE INVENTION

It is a primary object of the present invention to provide a magnetic bubble memory device provided with a bubble propagation path defined by a wide-gap pattern which, even if increased in density, produces a steep field gradient and a deep potential in the gap region between the pattern elements.

Another object of the present invention is to provide a magnetic bubble memory device provided with a bubble propagation path defined by a wide-gap pattern, in which the propagation characteristics of the outbound and return tracks approximate each other and the characteristic of the entire propagation path is satisfactory.

In accordance with the primary object above, a magnetic bubble memory device according to an aspect of the present invention comprises a magnetic layer in which magnetic bubbles can be moved, and a bubble propagation path defined by a pattern of magnetically soft elements, each of which has an asymmetrically crooked or curved shape with an entrance-side segment and an exit-side segment having different lengths and which are arranged on the surface of the magnetic layer at a predetermined period P in such a manner that the exit-side segment of one of the adjacent pattern elements is opposed to the outer side of the entrance-side segment of the other pattern element, with a gap therebetween, wherein the difference h (for instance as in FIG. 3) in length between the entrance-side segment and the exit-side segment of the pattern element is 10% to 25% of the height H of the pattern element.

In a preferred embodiment of the present invention, the width A of the entrance-side segment of the pattern element is 30% to 40% of the pattern period P, and the height H of the pattern element is 50% to 100% of the pattern period P.

Further, in a preferred embodiment of the present invention, the direction of bubble propagation along the bubble propagation path is perpendicular to the easy axis of magnetization in the magnetic layer, and a hold field for stably holding the bubble in the trap position in the bubble propagation path is applied to the pattern in the same direction as that of the easy axis of magnetization.

Furthermore, in accordance with the present invention, a magnetic bubble memory device according to another aspect of the present invention comprises a magnetic layer in which magnetic bubbles can be moved, and a bubble propagation path defined by a pattern of magnetically soft elements, each of which has an asymmetrically crooked or curved shape with an entrance-side segment and an exit-side segment having different lengths and which are arranged on the surface of the magnetic layer at a predetermined period in such a manner that the exit-side segment of one of the adjacent pattern elements is opposed to the outer side of the entrance-side segment of the other pattern element, with a gap therebetween, wherein the bubble propagation path has an outbound track and a return track which are arranged in parallel with each other and opposite to each other in the direction of bubble propagation, and the respective widths $A_1$ and $B_1$ of the entrance-side segment and the exit-side segment of the pattern element of the outbound track and the respective widths $A_2$ and $B_2$ of the entrance-side segment and the exit-side segment of the return track meet the conditions: $B_1/A_1 > B_2/A_2$; and $A_2 > A_1 \geq B_1 \geq B_2$.

The present invention is now described in detail based on the preferred embodiments, with reference to the accompanying drawings.

DESCRIPTION OF THE PREFERRED EMBODIMENTS

Figure 3:
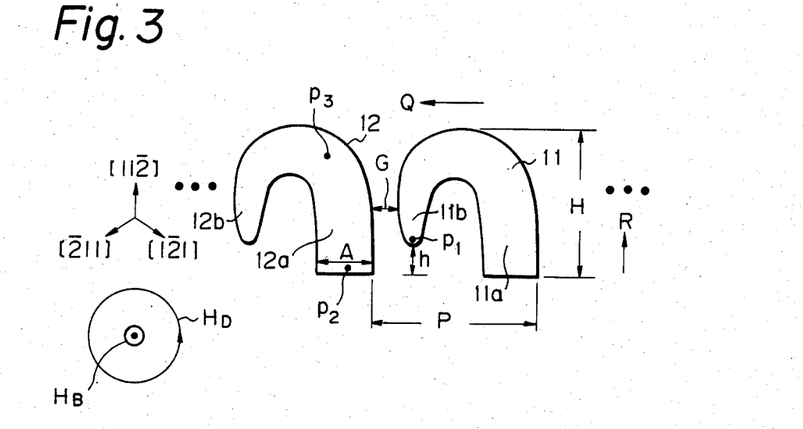
FIG. 3 illustrates a basic geometry of a bubble propagation path defined by the wide-gap pattern according to the present invention.

FIG. 3 illustrates a basic geometry of a bubble propagation path defined by the wide-gap pattern in a magnetic bubble memory device according to the present invention. This bubble propagation path is a minor loop used for the storage of information therein in the major-minor loop arrangement, and the reference numerals 11 and 12 designate elements of the bubble propagation pattern. These pattern elements 11 and 12 are formed of a 3200 to 3400 Å thickness of permalloy thin film on a 1200 to 1400 Å thickness $SiO_2$ spacer deposited on a magnetic thin film (i.e., bubble crystal) of, for example, magnetic garnet. Usually, for the suppression of hard bubbles, ions, such as $Ne^+$, are implanted in the surface of the bubble crystal under the condition of 4 to $6 \times 10^{13}/cm^2$, 50 keV (50/Ne+/4–6 E13). In FIG. 3, the reference characters and the arrows [1$\bar{2}$1], [11$\bar{2}$], and [$\bar{2}$11] show the easy axes of magnetization in the plane (111) of the bubble crystal, $H_B$ a bias field oriented from the rear side of the plane in the figure to the surface of the same, $H_D$ a triangular drive field rotating anticlockwise in the plane, Q a direction of bubble propagation, and R a hold field for stably holding the bubble in the trap position.

The pattern elements 11 and 12 have, asymmetrically crooked or curved shapes, each having an entrance-side segment 11a or 12a and an exit-side segment 11b or 12b, respectively, which have different lengths, and are arranged in the direction Q of bubble propagation perpendicular to the easy axis of magnetization [11$\bar{2}$] so that the exit-side segment 11b of the preceding pattern element 11 is opposed to the outer side of the entrance-side segment 12a of the succeeding pattern element 12, with a gap G therebetween. The reference character P designates a period of arrangement of the pattern elements, i.e., pattern period, H the height of the pattern element 11 or 12, h the difference in length between the entrance-side segment 11a or 12a and the exit-side segment 11b or 12b of the pattern element, and A the width of the entrance-side segment 11a or 12a.

The geometric parameters which influence the propagation characteristics, such as the field gradient and the potential in the gap region of this pattern, are the gap width G, the distance between a position $p_1$ at the exit-side segment 11b of the preceding pattern element 11 and a position $p_2$ at the entrance-side segment 12a of the succeeding pattern element 12, the width A of the entrance-side segment 12a, and the height H of the pattern element.

For example, where the pattern period P is 3.5 to 8 μm, the gap width G is favorably 0.5 to 1.2 μm, because a too wide gap causes the propagation characteristic to deteriorate, while a too narrow gap makes forming the pattern difficult, due to the limitations of photolithography.

Figure 4:
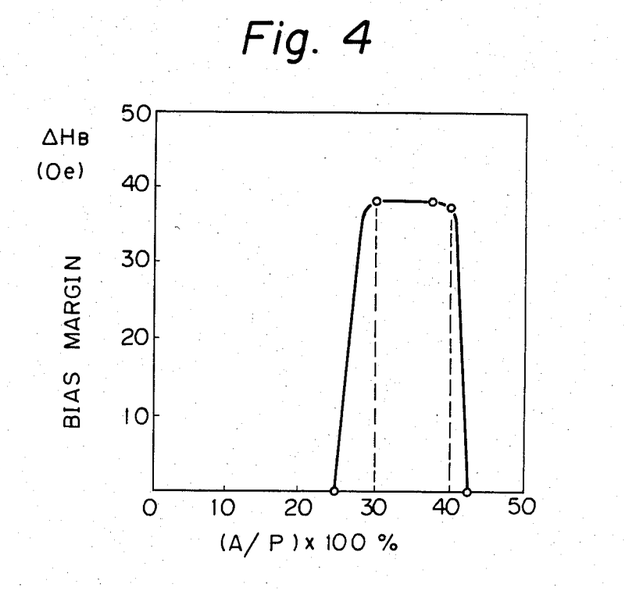
FIGS. 4 through 6 are diagrams showing the propagation characteristics of the bubble propagation path according to the present invention, in accordance with various geometric parameters, respectively.

FIG. 4 shows the relationship between the ratio A/P of the width A of the entrance-side segment 12a to the pattern period P and the bias margin $\Delta H_B$. It is thought that the smaller the segment width A, the larger the field gradient between the positions $p_1$ and $p_2$, due to the concentration of the magnetic pole in the position $p_2$. However, where the segment width A is too small, the drive force in the state wherein the bubble is moved from the position $p_2$ to the position $p_3$ along the entrance-side segment 12a is reduced, whereby the characteristic is deteriorated. On the contrary, where the segment width A is too large, the magnetic pole at the end portion of the entrance-side segment is dispersed, and thus the field gradient is small. Accordingly, as can be understood from FIG. 4, it is advantageous for the characteristic that the width A of the entrance-side segment 12a is 30% to 40% of the pattern period P. It should be noted that the exit-side segment 11b is made narrower than the entrance-side segment 12a, for example, having the width of 0.7A to 0.9A at its middle portion, in order to make the position $p_1$ as magnetically neutral as possible.

Figure 5:
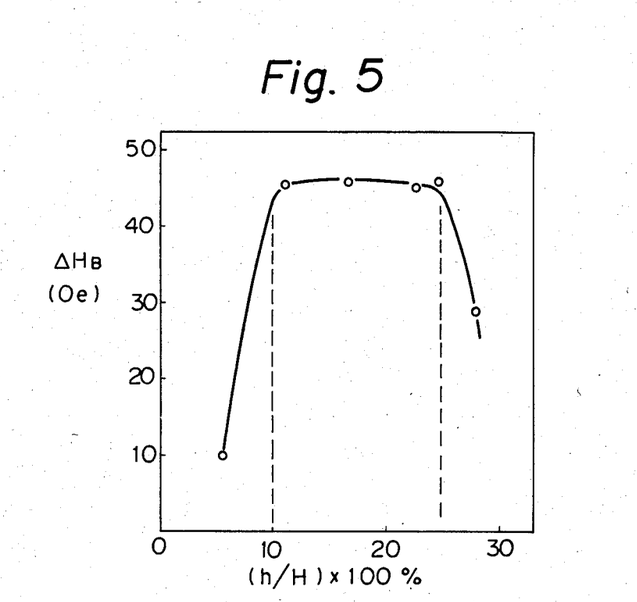

FIG. 5 shows the relationship between the ratio h/H of the length difference h between the entrance-side segment 12a and the exit-side segment 11b to the pattern element height H and the bias margin $\Delta H_B$. The smaller the length difference h, the shorter the distance between the positions $p_1$ and $p_2$, and thus the larger the field gradient. However, where the length difference h is too small, the magnetic pole at the position $p_1$ is too strong and, conversely, the field gradient is small. Accordingly, as can be understood from FIG. 5, it is advantageous for the characteristic that the length difference h between the entrance-side segment 12a and the exit-side segment 11b is 10% to 25% of the pattern element height H.

Figure 6:
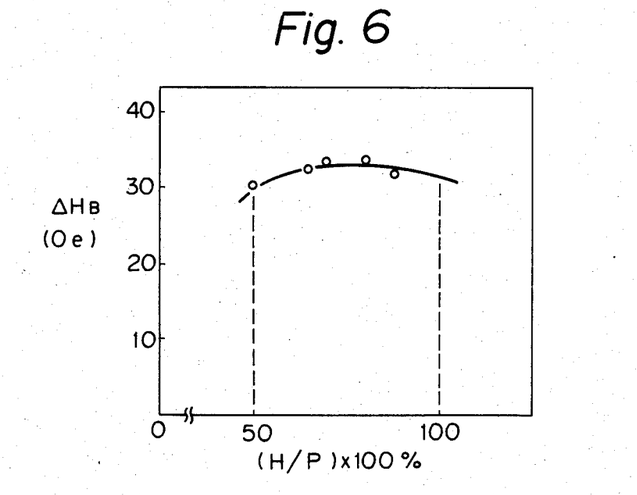

Further, FIG. 6 shows the relationship between the ratio H/P of the pattern element height H to the pattern period P and the bias margin $\Delta H_B$. Where the pattern element height H is too small, the magnetic pole at the position $p_2$ is weak, due to the reduction in geometric anisotropy, and thus the field gradient is small. On the contrary, a too large height H results in an increase in size of the cell of the pattern, and thus a reduction in memory density. Accordingly, it is advantageous that the pattern element height H is 50% to 100% of the pattern period P.

Figure 7:
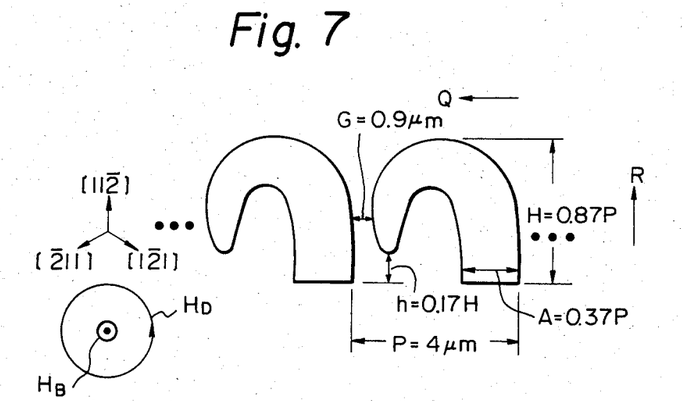
FIG. 7 illustrates a first concrete embodiment of the bubble propagation path according to the present invention.
Figure 8:
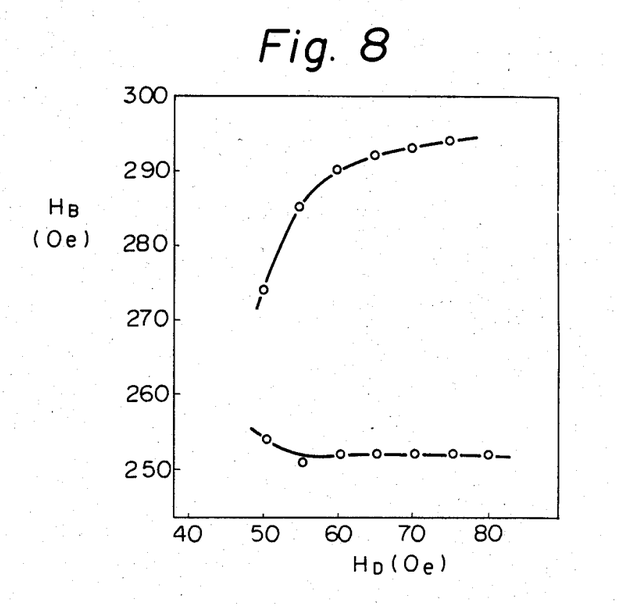
FIG. 8 is a diagram showing the propagation characteristic of the embodiment of FIG. 7.

FIG. 7 illustrates a concrete embodiment of the bubble propagation path with the pattern period P=4 $\mu$m, defined by the optimum wide-gap pattern resulting from the above, and FIG. 8 shows its propagation characteristic. In this pattern, the gap width G is 0.9 $\mu$m, the width A of the entrance-side segment is 37% of the pattern period P, the length difference h between the entrance-side segment and the exit-side segment is 17% of the pattern element height H, and the pattern element height H is 87% of the pattern period P. This pattern provides a very good propagation characteristic with a minimum drive field of 50 Oe and a bias margin of 33 Oe (under a triangular drive field of 70 Oe and bubble diameter of 1.3 $\mu$m), as shown in FIG. 8.

Figure 9:
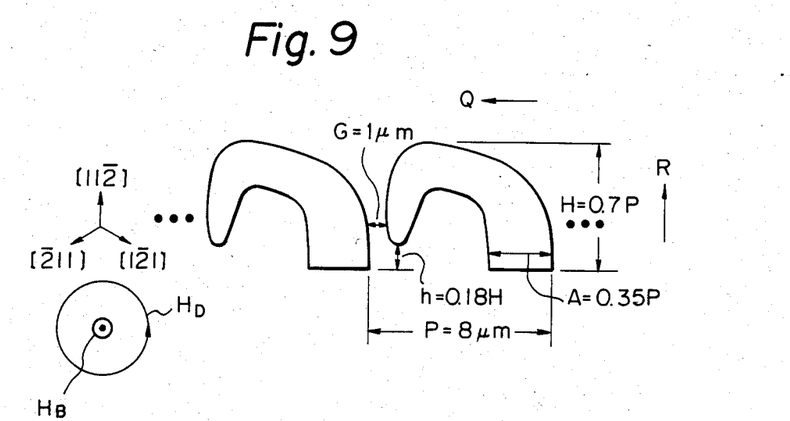
FIG. 9 illustrates a second concrete embodiment of the bubble propagation path according to the present invention.
Figure 10:
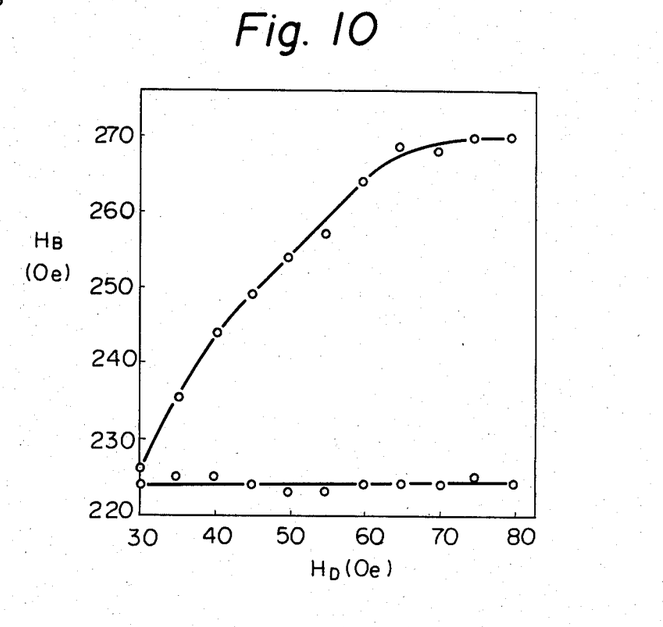
FIG. 10 is a diagram showing the propagation characteristic of the embodiment of FIG. 9.

FIG. 9 illustrates another concrete embodiment of the bubble propagation path with the pattern period P=8 $\mu$m, also defined by the optimum wide-gap pattern resulting from the above, and FIG. 10 shows its propagation characteristic. In this pattern, the gap width G is 1.0 $\mu$m, the width A of the entrance-side segment is 35% of the pattern period P, the length difference h between the entrance-side segment and the exit-side segment is 18% of the pattern element height H, and the pattern element height H is 70% of the pattern period P. This pattern provides a good propagation characteristic with a minimum drive field of 35 Oe and a bias margin of 45 Oe (under a triangular drive field of 70 Oe and bubble diameter of 1.3 $\mu$m), as shown in FIG. 10.

The above-described 4 $\mu$m-period pattern is suitable for use as the minor loop in the major-minor arrangement, while the 8 $\mu$m-period pattern is suitable for use as the major line adapted for writing and reading information into and out of the minor loops, or as the boot loop adapted for the storage of inferior loop information.

Now, a practical example of organizing a bubble propagation path by employing the above-described wide-gap pattern will be described. FIGS. 11 and 12 illustrate two conventional different arrangements of the bubble propagation path in the bubble memory, respectively. FIG. 11 illustrates a major-minor loop arrangement, wherein the reference character GE designates a bubble generator, DE a bubble detector, $M_1$ and $M_2$ major lines for the write-in and read-out of information, respectivley, m a minor loop for the storage of information, $G_1$ a gate for the write-in of information (transfer-in gate or swap gate), $G_2$ a gate for the read-out of information (transfer-out gate or replicate gate), and $C_1$ and $C_2$ conductors for the control of the respective gates $G_1$ and $G_2$. FIG. 12 illustrates a single loop (or serial loop) arrangement, wherein the reference character GE designates a bubble generator, DE a bubble detector, L a bubble propagation loop, G a gate for the read-out of information, and C a conductor for the control of the gate G.

As can be seen from FIGS. 11 and 12, the bubble propagation path usually has an outbound track and a return track, which are arranged in parallel to each other and opposite in direction of the bubble propagation to each other (shown by the arrows) and which are, in particular, essential for the minor loop m in the major-minor loop arrangement.

Figure 13:
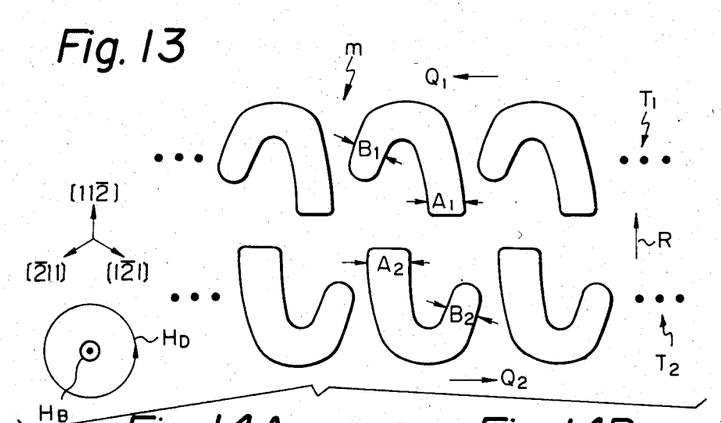
FIG. 13 illustrates a basic geometry of a bubble propagation path defined by the wide-gap pattern and having outbound and return tracks.
Figure 14A:
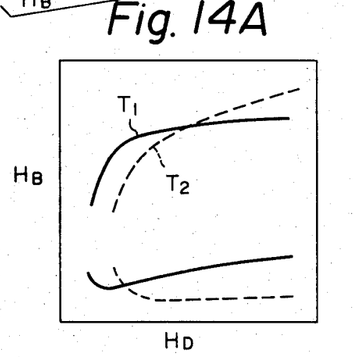
FIGS. 14A, 14B, and 14C are diagrams showing the propagation characteristics of the bubble propagation path illustrated in FIG. 13, in accordance with various widths of the pattern element, respectively.
Figure 14B:
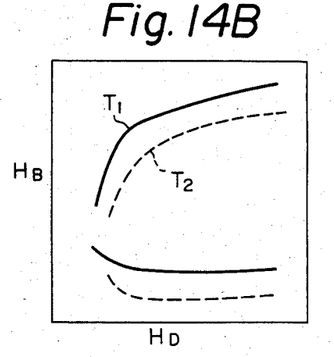

FIG. 13 illustrates a part of a minor loop m defined by the wide-gap pattern, wherein the reference characters $T_1$ and $T_2$ designate an outbound track and a return track parallel to each other, respectively, and $Q_1$ and $Q_2$ the directions of bubble propagation perpendicular to the easy axis of magnetization [11$\bar{2}$] and opposite to each other. In this propagation path, it is usual that the outbound track $T_1$ and the return track $T_2$ have different propagation characteristics, due to the geometrical relationship thereof with the easy axes of magnetization. For example, where the patterns of the outbound and return tracks are exactly the same, i.e., $B_1/A_1=B_2/A_2$ and $A_2=A_1>B_1=B_2$, wherein $A_1$ and $B_1$ are the widths of the entrance-side and exit-side segments of the pattern element in the outbound track $T_1$, respectively, and $A_2$ and $B_2$ are the widths of the entrance-side and the exit-side segment of the pattern element in the return track $T_2$, respectively, the bias margin in the outbound track $T_1$ is smaller than that in the return track $T_2$, as shown in FIG. 14A, and thus the bias margin in the entire propagation path is inferior.

Where $B_1/A_1 \cong B_2/A_2$, and $A_2 \cong A_1 > B_1 > B_2$, the operation regions of the outbound track $T_1$ and the return track $T_2$ disagree with each other with respect to the bias field, as shown in FIG. 14B, and thus the bias margin in the entire propagation path is inferior.

Figure 14C:
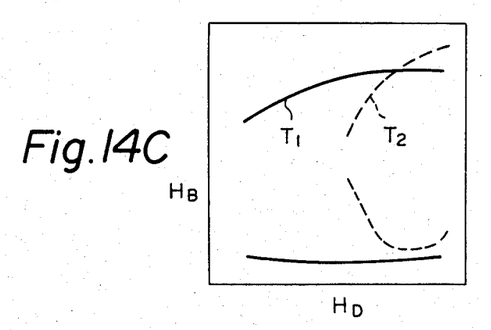

Further, where $B_1/A_1 < B_2/A_2$, and $A_2 \cong A_1 \cong B_1 > B_2$, the minimum drive field in the return track $T_2$ is very large, as shown in FIG. 14C.

Figure 15:
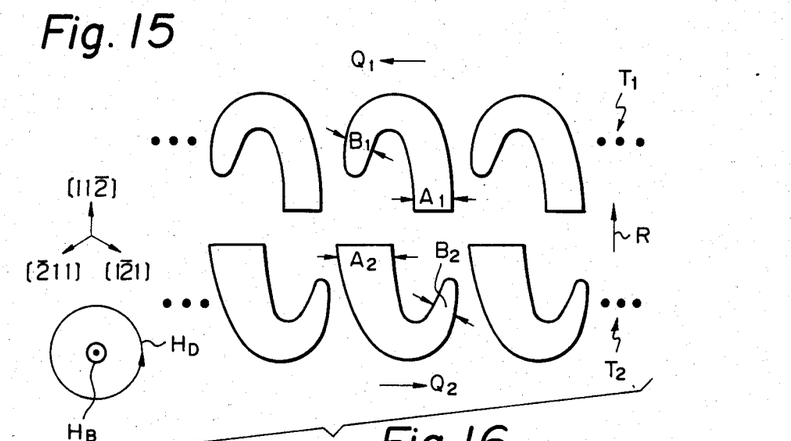
FIG. 15 illustrates a typical embodiment of a bubble propagation path having outbound and return tracks according to the present invention.
Figure 16:
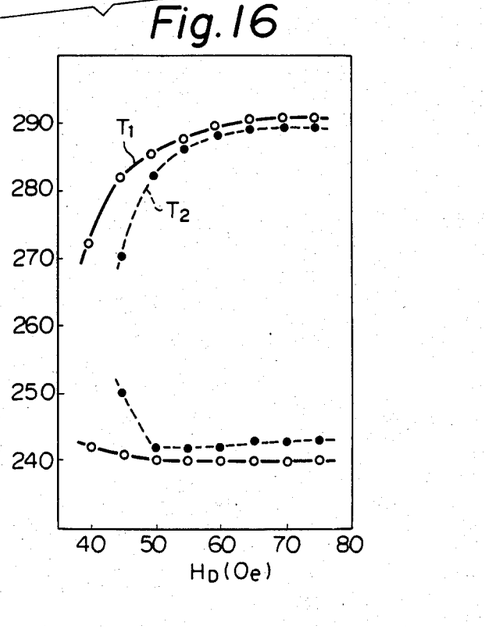
FIG. 16 is a diagram showing the propagation characteristic of the embodiment illustrated in FIG. 15.

Accordingly, the present invention provides a geometry having the conditions $B_1/A_1 > B_2/A_2$, and $A_2 > A_1 \geq B_1 \geq B_2$, as shown in FIG. 15. According to this geometry, the propagation characteristics in the outbound track $T_1$ and the return track $T_2$ approximate each other and the characteristic in the entire propagation path is satisfactory. For example, where the pattern period $P = 4$ μm, first, the geometry wherein $A_1 = 1.3 \pm 0.1$ μm, $A_2 = 1.5 \pm 0.1$ μm, and $B_1 = B_2 = 1.1 \pm 0.2$ μm, is desirable. In this case, the propagation characteristic is as shown in FIG. 16.

Figure 17A:
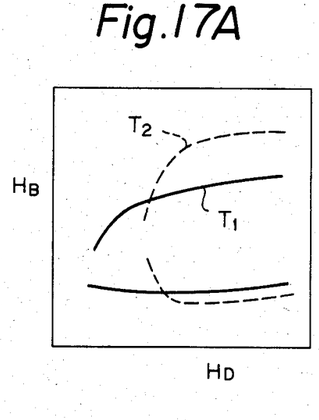
FIGS. 17A, 17B, and 17C are diagrams showing various examples of the deterioration in propagation characteristic in the propagation path different to that of the present invention, respectively.
Figure 17B:
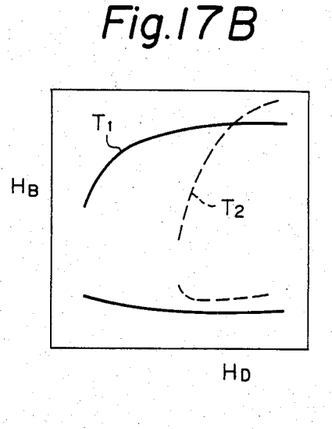
Figure 17C:
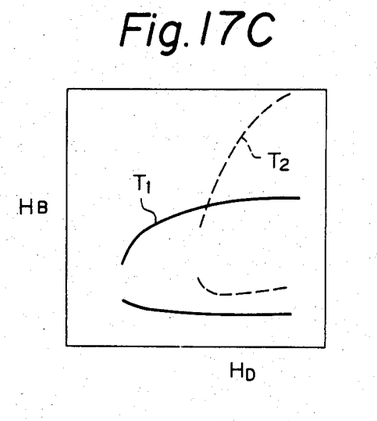

Deviation from the above-described condition results in a deterioration in the propagation characteristic as follows. Where $A_2 = A_1 \geq B_1 \geq B_2$, for example, $A_1 = A_2 = 1.5$ μm, and $B_1 = B_2 = 1.0$ μm, the minimum drive field in the outbound track $T_1$ is small, but the bias margin is reduced on the side of high bias field, as shown in FIG. 17A. Where $A_2 = A_1 \geq B_1 \geq B_2$ similarly, for example, $A_1 = A_2 = 1.3$ μm, and $B_1 = B_2 = 1.0$ μm, the minimum drive field in the return track $T_2$ is large, as shown in FIG. 17B. Where $A_1 > A_2 \geq B_1 \geq B_2$, for example, $A_1 = 1.5$ μm, $A_2 = 1.3$ μm, and $B_1 = B_2 = 1.0$ μm, the bias margin in the outbound track $T_1$ is reduced on the side of high bias field, and the minimum drive field in the return track $T_2$ is large, as shown in FIG. 17C. Further, where $B_1 > A_1 > A_2$, or $B_2 > A_1 A_2$, the bias margin cannot be obtained, although this is not illustrated, and the normal bubble propagation cannot be performed.

Next, where the pattern period $P = 5$ μm, the geometry wherein $A_1 = 1.6 \pm 0.1$ μm, $A_2 = 1.9 \pm 0.1$ μm, and $B_1 = B_2 = 1.1 \pm 0.2$ μm, is desirable. Moreover, where the pattern period $P = 6$ μm, the geometry wherein $A_1 = 2.0 \pm 0.2$ μm, $A_2 = 2.2 \pm 0.2$ μm, and $B_1 = B_2 = 1.0 \pm 0.2$ μm, is desirable. It should be noted that the tendency of the deterioration in propagation characteristic resulting from the deviation from the above-described condition is the same as in the case of 4 μm-period pattern, but the larger the pattern period, the smaller the extent of the deterioration.

Further, it is taken as a matter of course that the additional provision of the embodiment illustrated in FIG. 15 with the conditions as described hereinbefore with reference to FIGS. 3 through 6 makes it possible to realize a bubble propagation path having a very excellent propagation characteristic.

Furthermore, it is advantageous that, in the embodiments illustrated in FIGS. 3, 7, 9, and 15, the hold field R is applied in the direction of the easy axis of magnetization [112̄] perpendicular to the directions Q, $Q_1$, and $Q_2$ of bubble propagation. This is because, in the other directions, the drive force caused by the vector of the magnetic field in the direction of bubble propagation causes the propagation characteristic to deteriorate.

As described above, the present invention can provide a magnetic bubble memory device in which the memory capacity is large, the size is small, and the propagation characteristic is excellent.

What is claimed is:

1. A magnetic bubble memory device comprising:
    a magnetic layer in which magnetic bubbles can be moved;
    a bubble propagation path defined by a repeated pattern of magnetically soft pattern elements of predetermined period P, each of the pattern elements being of height H and having an asymmetrically crooked or curved shape with an entrance-side segment and an exit-side segment of different lengths in the direction of said height, said pattern elements being arranged on the surface of said magnetic layer at said predetermined period P in a direction traverse to the direction of said height of said segments in such a manner that the exit-side segment of one of the adjacent pattern elements is opposed to the outer side of the entrance-side segment of the other pattern element, with a gap therebetween, the difference h in said lengths of said entrance-side and exit-side segments of each pattern element being in the range of from 10% to 25% of the height H of the pattern element;
    trap positions along said bubble propagation path, the direction of bubble propagation along the bubble propagation path being perpendicular to an easy axis of magnetization in the magnetic layer; and
    a hold field for stably holding the bubble in each said trap position in the bubble propagation path being applied to the pattern in the same direction as that of said easy axis of magnetization.

2. A magnetic bubble memory device according to claim 1, wherein the width A of the entrance-side segment of the pattern element is 30% to 40% of the pattern period P.

3. A magnetic bubble memory device according to claim 1, wherein the height H of the pattern element is 50% to 100% of the pattern period P.

4. The device of claim 1, said bubble propagation path having outbound and return tracks oriented in parallel with opposite directions of bubble propagation, wherein the propagation characteristics of said outbound and return tracks approximate each other.

5. The device of claim 1, wherein said period P is as small as 3.5 microns.

6. A magnetic bubble memory device comprising:
    a magnetic layer in which magnetic bubbles can be moved;
    a bubble propagation path defined by a repeated pattern of magnetically soft pattern elements of predetermined period P, each of the pattern elements being of height H and having an asymmetrically crooked or curved shaped with an entrance-side segment and an exit-side segment of different lengths in the direction of said height, said pattern elements being arranged on the surface of said magnetic layer at said predetermined period P in a direction traverse to the direction of said height of said segments in such a manner that the exit-side segment of one of the adjacent pattern elements is opposed to the outer side of the entrance-side segment of the other pattern element, with a gap therebetween, the difference h in said lengths of said entrance-side and exit-side segments of each pattern element being in the range of from 10% to 25% of the height H of the pattern element; and
    said bubble propagation path having an outbound track and a return track, which said tracks are arranged in parallel with and oppositely to each other with respect to the direction of bubble propagation, and the respective widths $A_1$ and $B_1$ of the entrance-side segment and the exit-side segment of the pattern element of the outbound track and the respective widths $A_2$ and $B_2$ of the entrance-side segment and the exit-side segment of the return track meet the conditions:

$B_1/A_1 > B_2/A_2$; and $A_2 > A_1 \geq B_1 \geq B_2$.

7. The device of claim 6, wherein the propagation characteristics along said outbound and return tracks approximate each other.

8. A magnetic bubble memory device comprising:
a magnetic layer in which magnetic bubbles can be moved; and
a bubble propagation path defined by a pattern of magnetically soft elements, each of the pattern elements having an asymmetrically crooked or curved shape with an entrance-side segment and an exit-side segment having different lengths, said pattern elements being arranged on the surface of said magnetic layer at a predetermined period P in such a manner that the exit-side segment of one of the adjacent pattern elements is opposed to the outer side of the entrance-side segment of the other pattern element, with a gap therebetween,
wherein the bubble propagation path has an outbound track and a return track, which are arranged in parallel with and opposite to each other in the direction of bubble propagation, and the respective widths $A_1$ and $B_1$ of the entrance-side segment and the exit-side segment of the pattern element of the outbound track and the respective widths $A_2$ and $B_2$ of the entrance-side segment and the exit-side segment of the return track meet the conditions;

$B_1/A_1 > B_2/A_2$; and $A_2 > A_1 \geq B_1 \geq B_2$.

9. The device of claim 8, wherein said period P is as small as 3.5 microns.

10. A magnetic bubble memory device according to claim 8, comprsing trap positions along said bubble propagation path, wherein the directions of bubble propagation along said outbound and return tracks of the bubble propagation path are perpendicular to an easy axis of magnetization in the magnetic layer, and a hold field for stably holding the bubble in each said trap position in the bubble propagation path is applied to the pattern in the same direction as that of said easy axis of magnetization.

11. The device of claim 10, wherein the propagation characteristics along said outbound and return tracks approximate each other.

* * * * *

UNITED STATES PATENT AND TRADEMARK OFFICE
CERTIFICATE OF CORRECTION

PATENT NO. : 4,698,786
DATED : October 6, 1987
INVENTOR(S) : Masashi AMATSU et al.

It is certified that error appears in the above-identified patent and that said Letters Patent is hereby corrected as shown below:

Col. 1,    line 12, change "half disk" to --half-disk--;

line 64, change "making" to --adapting--, and delete "fit".

Col. 4,    line 41, change "[112]" to --[11$\bar{2}$]--.

Signed and Sealed this

Seventh Day of June, 1988

*Attest:*

DONALD J. QUIGG

*Attesting Officer*      *Commissioner of Patents and Trademarks*